United States Patent
Riemer

(10) Patent No.: US 7,268,471 B2
(45) Date of Patent: Sep. 11, 2007

(54) PIEZO ACTUATOR COMPRISING A STRUCTURED EXTERNAL ELECTRODE

(75) Inventor: Steffen Riemer, Stainz (AT)

(73) Assignee: Epcos AG, Munich (DE)

( * ) Notice: Subject to any disclaimer, the term of this patent is extended or adjusted under 35 U.S.C. 154(b) by 139 days.

(21) Appl. No.: 10/505,185

(22) PCT Filed: Jan. 20, 2003

(86) PCT No.: PCT/DE03/00141

§ 371 (c)(1),
(2), (4) Date: Sep. 29, 2004

(87) PCT Pub. No.: WO03/073523

PCT Pub. Date: Sep. 4, 2003

(65) Prior Publication Data

US 2005/0116220 A1   Jun. 2, 2005

(30) Foreign Application Priority Data

Feb. 22, 2002   (DE) ................. 102 07 530

(51) Int. Cl.
*H01L 41/047* (2006.01)
*H01L 41/083* (2006.01)
(52) U.S. Cl. .............. 310/365; 310/364; 310/366
(58) Field of Classification Search ............. 310/328, 310/363–366
See application file for complete search history.

(56) References Cited

U.S. PATENT DOCUMENTS

| | | |
|---|---|---|
| 4,523,121 A | 6/1985 | Takahashi et al. |
| 4,978,881 A | 12/1990 | Wakita et al. |
| 5,406,164 A | 4/1995 | Okawa et al. |
| 5,523,645 A * | 6/1996 | Inoi .................... 310/364 |
| 6,208,026 B1 | 3/2001 | Bindig et al. |
| 6,292,353 B1 | 9/2001 | Haratani et al. |
| 6,507,140 B1 * | 1/2003 | Heinz et al. ........... 310/366 |
| 6,597,086 B1 * | 7/2003 | Boecking ............... 310/366 |
| 6,731,050 B2 | 5/2004 | Bindig et al. |
| 2002/0089266 A1 | 7/2002 | Bindig et al. |
| 2002/0158551 A1 | 10/2002 | Bindig et al. |

FOREIGN PATENT DOCUMENTS

| | | |
|---|---|---|
| DE | 196 48 545 | 5/1998 |
| DE | 100 26 635 | 1/2002 |
| EP | 0 576 707 | 7/1992 |
| EP | 1 162 671 | 12/2001 |
| EP | 1 204 152 | 5/2002 |
| EP | 1 239 525 | 9/2002 |
| JP | 57-025798 | * 7/1980 |
| JP | 58-186928 | * 11/1983 |
| JP | 4-206786 | * 7/1992 |
| JP | 05-335643 | 12/1993 |
| JP | 05335643 | 12/1993 |
| JP | 8-316095 | * 11/1996 |

* cited by examiner

*Primary Examiner*—Thomas M. Dougherty
(74) *Attorney, Agent, or Firm*—Fish & Richardson P.C.

(57) ABSTRACT

An electrical component includes a base having ceramic layers and internal electrodes between at least some of the ceramic layers. The electrical component also includes an external electrode on a face of the base, which contacts at least some of the internal electrodes. The external electrode includes a layer having at least one local minimum.

23 Claims, 3 Drawing Sheets

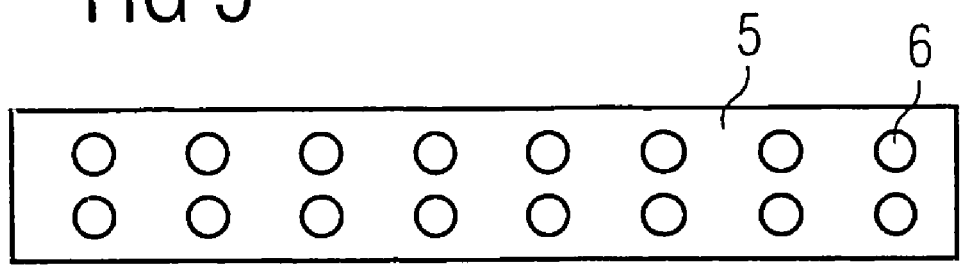
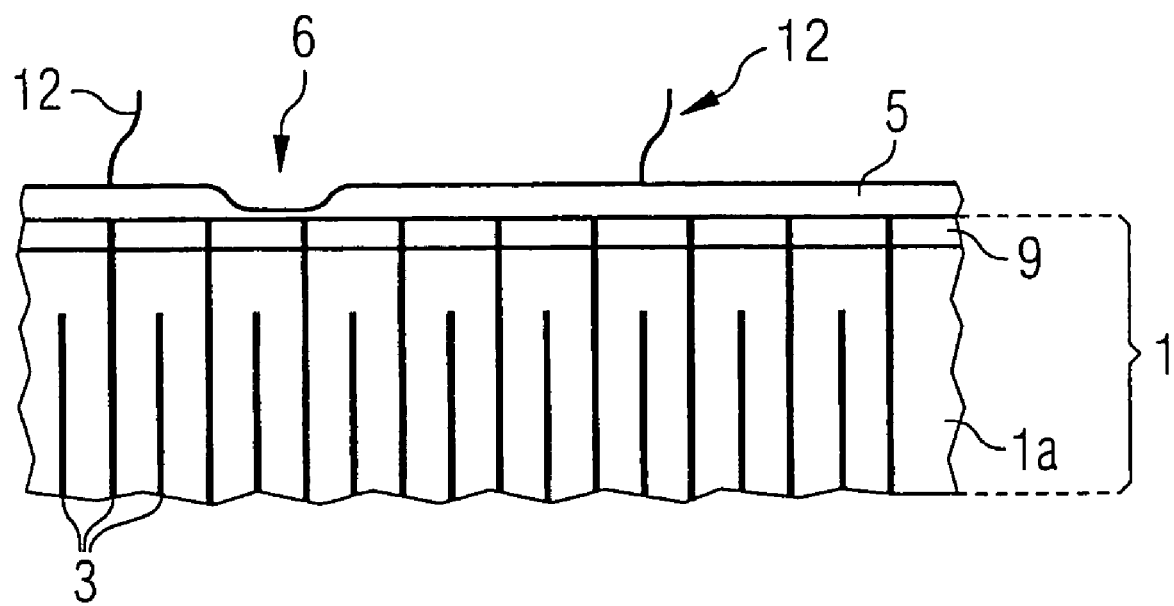

PIEZO ACTUATOR COMPRISING A STRUCTURED EXTERNAL ELECTRODE

TECHNICAL FIELD

This patent application describes an electrical multi-layer component, in particular a peizo actuator. This patent application also describes a method for producing such an electrical multi-layer component.

BACKGROUND

Piezo actuators are known that have a base body, with a stack of stratified ceramic layers, and internal electrodes lying between them. The internal electrodes are made from a mixture of silver and palladium. The ceramic layers contain a ceramic based on lead zirconium titanate, which has a piezoelectric effect because of its ferroelectric properties. Because of the piezoelectric effect, the ceramic expands when electrical potential is present, so that it is possible to make actuators from such a multi-layer ceramic.

Also present in the known piezo actuators are outer electrodes, which are applied continuously to one lateral face of the base body and contact the internal electrodes.

In order to reduce the costs of producing the piezo actuators, an effort is made to replace the material of the internal electrodes and the material of the outer electrode with copper. In known piezo actuators, the outer electrode has the form of a continuous layer. This form of the outer electrode is not suitable for outer electrodes made of copper. Under thermal demands, which occur, for example, when contact elements are soldered onto the outer electrode, with a continuous layer there is a shearing force between the outer electrode and the base body of the piezo actuator, which leads to damage to the boundary layer between the outer electrode and the base body.

This damage to the boundary layer is accompanied by a reduction of the effective bonding area between the outer electrode and the base body.

A piezo actuator produced in this manner is subjected, in the course of its use, to a multitude of mechanical strains, which in turn lead to shearing forces between the base body and the outer electrode. Because of the relatively high strength of the copper electrode, these additional loads result in the damage that arises when the thermal load spreads across the surface of the boundary layer and leads to detachment of the outer electrode. Thus the piezo actuator fails and can no longer be used.

SUMMARY

Described herein an electrical multi-layer components and a method for producing it, where the danger of detachment of the outer electrode is reduced.

An electrical multi-layer component is described that includes a base body. The base body contains a stack of stratified ceramic layers, and internal electrodes lying between them. An outer electrode is placed on one lateral face of the base body, for contacting internal electrodes.

The outer electrode has the form of a layer in which at least one indentation is provided.

At the place of the indentation, the thickness of the layer can be reduced. That results in an intended tear point at this location, at which the tensile and compressive strength of the layer or outer electrode is reduced. As a result, even relatively small shearing forces of the outer electrode against the base body are sufficient to produce a tear through the layer at the intended tear point. As a result, the shearing load acting on the entire layer can be significantly reduced, since the tensile and compressive forces that produce the shearing load along the layer or along the surface of the base body can only add up over a correspondingly shorted distance.

In particular, the layer can have a local minimum thickness at the location of the indentations.

In just the same way, however, it is also to design the indentation in the outer electrode in such a way that the outer electrode is interrupted at the location of the indentation. As a result, in a sense a tear is provided already when the outer electrode is produced, so that it is inherently impossible for great shear forces to result from addition of tensile and compressive forces over long distances.

The outer electrodes can have areas with essentially constant layer thickness, which has the benefit that outer electrode can be applied via a screen-printing present.

In an embodiment of the electrical multi-layer component, the outer electrode contains copper, enabling the material costs for the component to be reduced.

Furthermore, it is beneficial if the ceramic layers are piezoelectrically active. This is beneficial because the electrical multi-layer component can be used as a piezo actuator. A piezoelectric effect is obtained, for example, through the use of a ceramic based on lead zirconate titanate.

The indentations can run in the form of troughs, with the troughs extending along a longitudinal axis. The projection of these longitudinal axes on the lateral face of the stack of stratified ceramic layers or internal electrodes on the side of the outer electrode intersects the internal electrodes at an angle. That increases the chances that every internal electrode that runs along the corresponding outer surface of the stack can be contacted.

This means that the angle $\alpha$ takes on a value that 0 and 180°.

It is possible to advantageously arrange a plurality of indentations at equal distances. This has the benefit that the outer electrode is divided uniformly into a plurality of areas, which means a corresponding reduction in the maximum occurring shearing force.

In addition, a plurality of indentations can be distributed uniformly over the layer.

Furthermore, ti is also possible to arrange a plurality of indentations in such a way that they form a periodically recurring structure (for example a rhombus or square).

In order to promote the function of the indentation as an intended tear point, it is advantageous for the minimum layer thickness at the point of the indentation to be a maximum of 75% of the layer thickness in the area where the layer thickness is essentially constant.

The outer electrode can be applied in the form of a screen-printing paste that contains copper powder.

Applying the outer electrode in the form of a screen-printing paste has the benefit that by using appropriate screen-printing masks; a reliable and uniform arrangement of indentations can be achieved.

When applying the outer electrode in the form of a screen printing paste or by a screen printing process, the indentations may have a minimum width of 200 µm, since otherwise it may not be possible to guarantee a defined indentation on the basis of the consistency of the paste or the mesh number used. Smaller indentations can be realized only with increased effort and expense, due to the low viscosity of the screen-printing paste normally used. It would be conceivable, however, to produce indentations with smaller lateral extents by using a more structurally viscous or more thixotropic screen-printing paste.

In addition, a method for producing an electrical multi-layer component is specified that includes the following:

a) Production of a base body with a stack of stratified ceramic layers and internal electrodes lying between them, and with an outer electrode placed on a lateral face of the base body for contacting internal electrodes, which has the form of a layer and in which at least one indentation is provided.

b) Contacting of the outer electrode with a contact element while exerting a shearing load between the outer electrode and the lateral face of the base body.

Normally materials are used for the ceramic layers and the outer electrode whose thermal expansion coefficients differ from each other.

The method for producing the multi-layer electrical component has the advantage that in spite of exerting the shearing load, because of the intended tear points or already existing tears formed by the indentation, the danger of detachment of the outer electrode is reduced.

Despite the use of materials to their particular function with normally differing thermal expansion coefficients for the outer electrode and ceramic layers, the foregoing method allows the contacting of the outer electrode with a contact element to take place by soldering.

When copper is used for the outer electrode and when a PZT ceramic is used for the ceramic layers of the stack, the possible exists of performing the soldering at a temperature >200° C., which allows the use of correspondingly high-melting solders. Such high-melting solders have the advantage that they permit use of the electronic components, for example a piezo actuator, at temperatures of up to 150° C., such as occur, for example, on the combustion engine of a motor vehicle.

Embodiments will now be explained in greater detail with reference to corresponding figures.

DESCRIPTION OF THE DRAWINGS

FIG. 5 shows indentations arranged along a regular grid.

FIG. 6 shows an example of an electrical multi-layer components with an intermediate layer formed at the edge of the base body.

DETAILED DESCRIPTION

Figure 1:
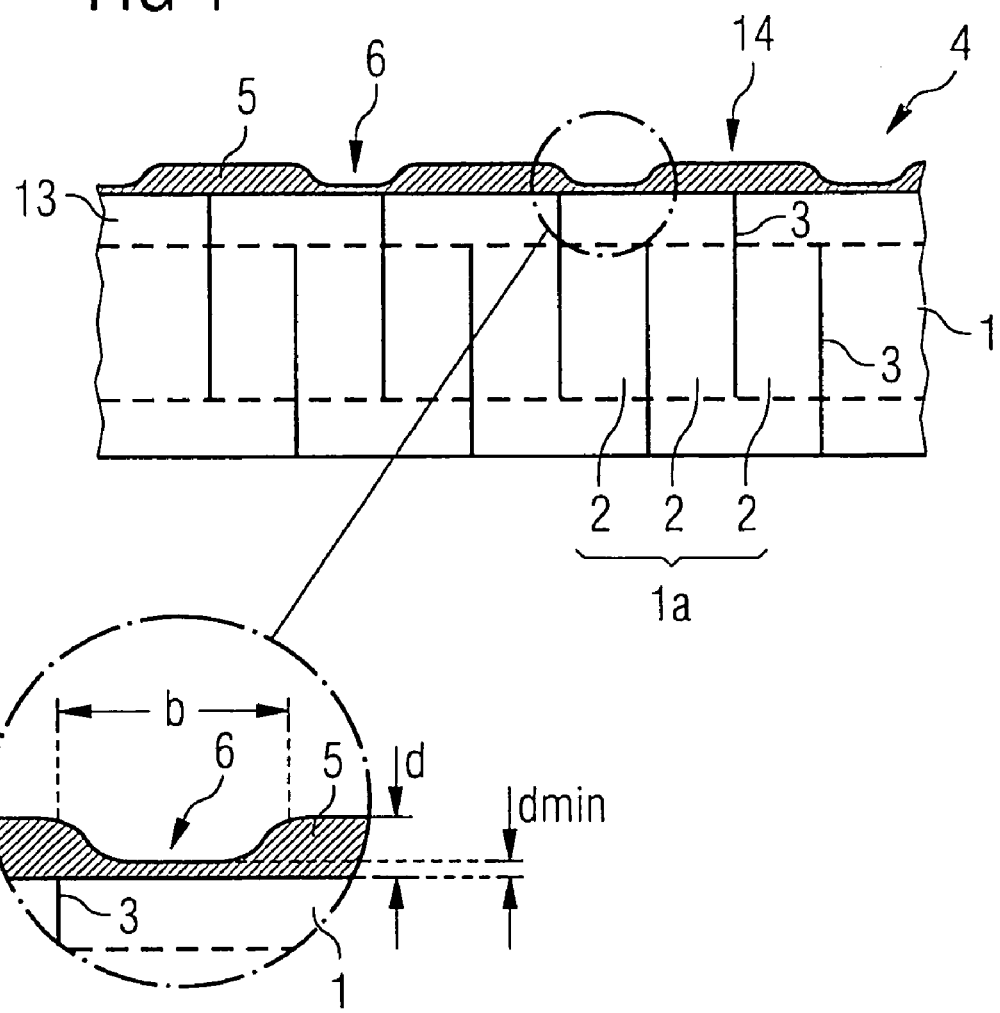
FIG. 1 shows an example of an electric multi-layer component in schematic cross-section.

FIG. 1 shows a piezo actuator, with a base body 1 that includes a stack 1a of stratified ceramic layers 2 and internal electrodes 3 lying between them. The piezo actuator or the base body 1 is shown lying down. The base and cover surface of stack 1a are thus located on the right and left sides of FIG. 1, respectively. The internal electrodes 3 reach alternately to the upper edge and to the lower edge of stack 1a. Along passive zones 13 only every second internal electrode 3 is present, so that in this zone only a very small deflection of the piezo actuator results when an electrical potential is applied between the internal electrodes 3 emerging from the lower end of stack 1a and those emerging from the upper end of stack 1a.

An outer electrode 5 is placed on the upper lateral face 4 of the base body 1, for contacting internal electrodes 3. The outer electrode 5 has indentations 6. It can be seen from the detailed view of FIG. 1 that the indentations 6 are in the form of local minima of the layer that determines the form of the outer electrode. Within the indentation 6, the layer thickness d is a minimum of $d_{min}$. In addition, the outer electrode 5 has areas of essentially constant layer thickness d, which means that in these areas the layer thickness d varies by less than 10%. It can also be seen from the detail of FIG. 1 that the indentation 6 has a width b, which should not fall below a certain minimum dimension when the outer electrode is applied by a screen printing process, since otherwise the normally used screen printing processes have to be specially adapted, for example by using a more structurally viscous screen printing paste.

The minimum layer thickness $d_{min}$ in the area of indentation 6 should be not more than 75% of the layer thickness d of the outer electrode 5, since it may not otherwise be possible to guarantee the intended tear point.

The minimum layer thickness $d_{mm}$ in the area of indentation 6 should be not more than 75% of the layer thickness d of the outer electrode 5, since it may not otherwise be possible to guarantee the intended tear point.

Figure 2:
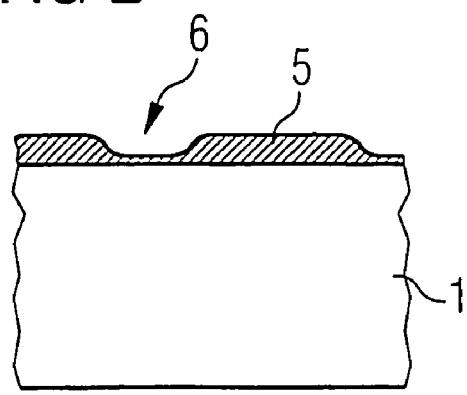
FIG. 2 shows an additional embodiment of an outer electrode.

An additional embodiment is shown in FIG. 2. There, the outer electrode 5 on the lateral face 4 of the base body 1 is interrupted at the point of the indentation 6. This means that the layer thickness d is zero in the area of the indentation 6. The embodiment has the advantage that under a thermal load, for example, the outer electrode 5 does not have to tear only at the location of intended tear point, but that the interruptions already exist and the maximum occurring shearing force is already inherently reduced (see also the explanation for FIG. 3).

Figure 3:
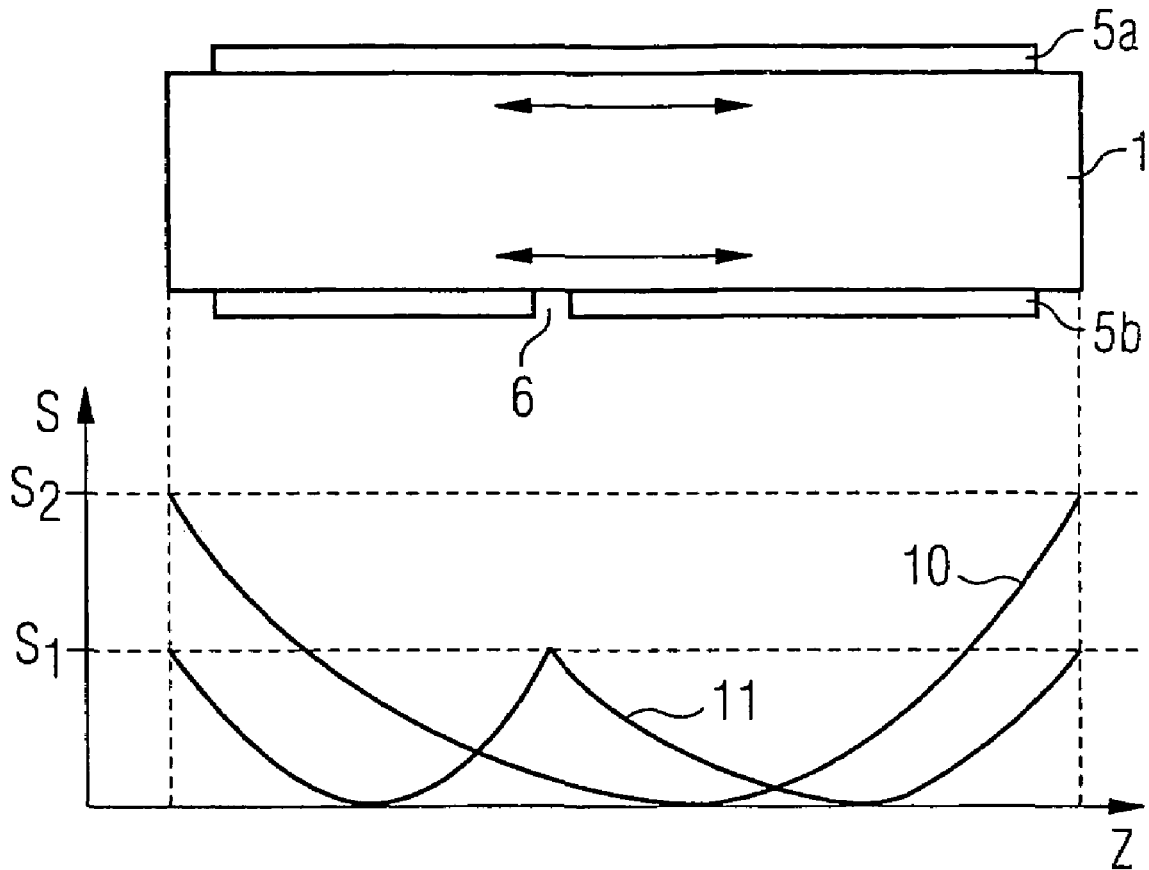
FIG. 3 shows different profiles of shearing forces with a continuous and an interrupted outer electrode.

FIG. 3 explains the effect that interrupting an external electrode 3 has on the shearing forces that occur in the case for example of a deflected piezo actuator. To this end, the base body 1 of a piezo actuator is shown schematically in FIG. 3. The deflection of the piezo actuator is represented schematically by double arrows. On the top side of base body 1, a continuous outer electrode 5a is shown. On the bottom of the piezo actuator or of base body 1, an outer electrode 5b interrupted by the indentation 6 is shown schematically in cross section. If one considers the same tensile stress for the upper outer electrode 5a and the lower outer electrode 5b (indicated by the two double arrows), this produces the profile shown below FIG. 3 for the qualitative profile. Curve 10 describes the profile of the shear stress S as a function of the longitudinal coordinate z of base body 1 for the continuous outer electrode 5a. On the outer hand, curve 11 describes the profile of the shear stress S as a function of the longitudinal coordinate z of base body 1 for the interrupted outer electrode 5b.

Since the tensile or compressive stresses add up over a longer distance in the case of the outer electrode 5a, the grater maximum shear load also arise for the outer electrode 5a, identified in FIG. 3 as $S_2$. In the case of the interrupted outer electrode 5b, the tensile or compressive stress can only add up over a shorter distance, which leads to the fact that a smaller maximum shearing load $S_1$ results, as can be seen from the profile of curve 11. This lower maximum shear stress results in a reduction of the danger that the outer electrode 5b will tear off under a mechanical load, for example by pulling on wires connected to the outer electrode 5b, or also by a plurality of deflections of the piezo actuator.

A favorable minimum width b is around 200 μm. A typical layer thickness d producible by screen printing processes is around 15–25 μm.

Figure 4:
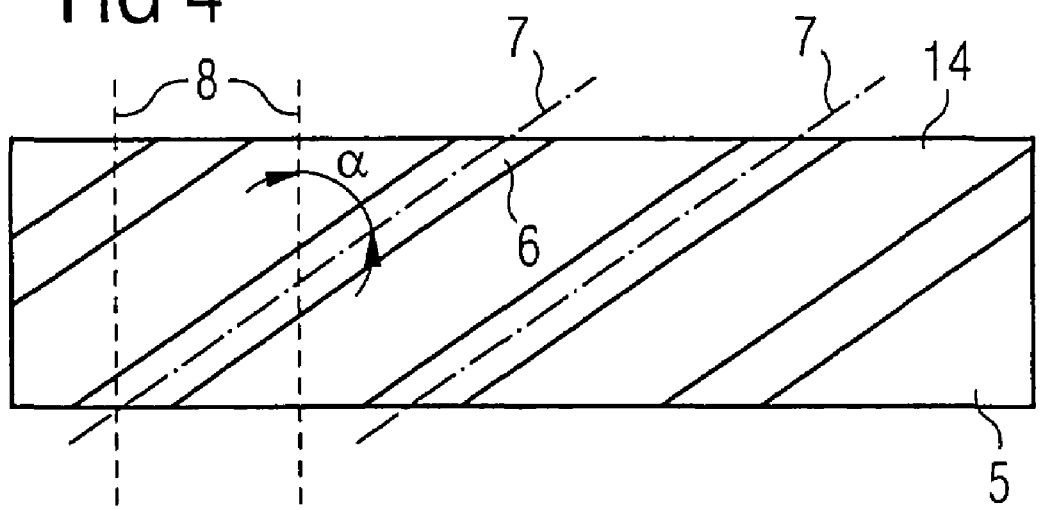
FIG. 4 shows indentations in the form of troughs.

FIG. 4 shows indentations 6 in an outer electrode 5 in the form of troughs running along a longitudinal axis 7. FIG. 4 is a top view of an example of an outer electrode 5. In addition, FIG. 6 shows lines 8 that symbolize the profile of the internal electrodes 3 corresponding to FIG. 1. The longitudinal axes 7 run essentially parallel to each other and intersect the lines 8 at an angle α, which is other than 0° and 180°. The result is that every second internal electrode, represented by lines 8, is contacted by areas 14 with an essentially constant layer thickness d of the outer electrode 5. This makes it possible to ensure that every second internal electrode 3 is contacted by the outer electrode 5 or by areas 14 with an essentially constant layer thickness of the outer electrode 5.

FIG. 5 shows a top view of another exemplary embodiment for a structured outer electrode 5. Here indentations in the form of circles are provided, which form a square grid.

When the outer electrode 5 is applied in the form of a screen printing paste, it is usual to use a screen printing paste that contains glass frit. This glass frit is used to improve the mechanical bonding of the outer electrode 5 to the base body 1. Depending on the glass frit used and depending on the ceramic used, or depending on the setting of additional process parameters, it can occur that the glass frit forms an intermediate layer 9 lying between the outer electrode 5 and the edge of the base body 1, which intermediate layer 9 is interrupted in the area of the internal electrodes 3. When considering the problem of the shearing off or separation of the outer electrode 5, the intermediate layer 9 of glass frit must be allocated to the base body 1, as can be seen from FIG. 6. Detachment processes may take place between the outer electrode 5 and the intermediate layer 9.

FIG. 6 also shows two contact elements 12, which may be in the form, for example, of thin wires, and which are connected to the outer electrode 5 by soldering. When a PZT ceramic is used for the ceramic layers that has a thermal expansion coefficient of $1.5$–$2.0 \times 10^{-6}$ m/mk, and when using an outer electrode 5 of copper with a thermal expansion coefficient of $19 \times 10^{-6}$ m/mk, providing the indentations 6 results in the possibility of performing the soldering of the contact elements 12 at a temperature of around 300° C., which permits the use of high-melt solders, for example Pb-based solders.

For the glass frit it is possible, for example, to use a combination that contains lead oxide, silicon oxide, boric oxide and possibly additional components.

The apparatus and methods described herein are not limited to use in piezo actuators, but may be applied to all multi-layer components, for example also to capacitors.

What is claimed is:

1. An electrical component comprising:
 a base comprising:
  ceramic layers, and
  internal electrodes among at least some of the ceramic layers; and
 an external electrode on a face of the base, the external electrode contacting at least some of the internal electrodes, the external electrode comprising a layer that has an indentation, wherein a thickness of the layer at the indentation is a local minimum thickness.

2. The electrical component of claim 1, wherein the external electrode comprises areas having a layer thickness that is substantially constant.

3. The electrical component of claim 1, wherein the external electrode comprises copper.

4. The electrical components of claim 1, wherein the ceramic layers are piezoelectrically active.

5. The electrical component of claim 1, wherein the layer of the external electrode comprises plural indentations, the plural indentations being disposed at an angle relative to the face of the base.

6. The electrical component of claim 1, wherein the layer of the external electrode comprises plural indentations, the plural indentations being spaced apart from one another at substantially equal distances.

7. The electrical components of claim 1, wherein the layer of the external electrode comprises plurality indentations, the plural indentations being distributed substantially uniformly over the external electrode.

8. The electrical component of claim 1, wherein the layer of the external electrode comprises plural indentations, the plural indentations forming a periodically recurring pattern.

9. The electrical component of claim 1, wherein the external electrode has a substantially constant layer thickness at area other than the indentation.

10. The electrical component of claim 9, wherein the indentation has a maximum of 75% of the substantially constant layer thickness.

11. The electrical component of claim 1, wherein the external electrode is formed from a screen processing paste containing copper powder.

12. The electrical component of claim 1, wherein the indentation has a width of at least 200 μm.

13. A method for producing an electrical component, comprising:
 producing a base, the base comprising:
  ceramic layer, and
  internal electrodes among at least some of the ceramic layers, a face of the base comprising an external electrode that contacts at least some internal electrodes, the external electrode comprising a layer that has an indentation, wherein a thickness of the layer at the indentation is a local minimum thickness:
 establishing contact between the external electrode and a contact element; and
 exerting a shearing force between the external electrode and the face of the base containing the external electrode.

14. The method of a claim 13, wherein the external electrode and the ceramic layers comprise materials with differing thermal expansion coefficients; and
 wherein soldering is used to establish contact between the external electrode and the contact element.

15. The method of claim 14, wherein the external electrode comprises copper, the ceramic layers comprise a PZT ceramic, and the method further comprises:
 attaching wires to the external electrode by soldering at a temperature that is greater than 200° C.

16. The method of claim 13, wherein the shearing force is exerted while contact is being established.

17. An electrical component comprising:
 ceramic layers;
 electrodes among at least some of the ceramic layers, the ceramic layers and the electrode layers together forming a stack having a first surface and a second surface, the electrode layers comprising alternating first electrodes and second electrodes, the first electrodes extending to the first surface but not to the second surface, the second electrodes extending to the second surface but not to the first surface; and
 an external electrode on the first surface, the external electrode contacting the first electrodes, and the external electrode comprising a layer having one or more local indentations, wherein a thickness of the layer at an indentation is a local minimum thickness.

18. The electrical component of claim 17, wherein the stack comprises passive zones adjacent to the first surface and the second surface.

19. The electrical component of claim 17, wherein each of the one or more indentations in the layer comprising the external electrode is a local minimum thickness.

20. The electrical component of claim 19, wherein each of the one or more indentations are at least 25% less thick than a remainder of the layer comprising the external electrode.

21. The electrical component of claim 17, further comprising one or more wires soldered to the external electrode.

22. The electrical component of claim 17, wherein the one or more indentations form troughs that are at an angle relative to the first surface of the stack.

23. The electrical component of claim 22, wherein the troughs form substantially regular patterns on the first surface of the stack.

* * * * *